United States Patent
Xue et al.

(10) Patent No.: US 9,206,339 B2
(45) Date of Patent: Dec. 8, 2015

(54) METHOD FOR PREPARATION OF POLYESTER/POLYOLEFIN HOT-MELT ADHESIVE FOR USE IN A SOLAR CELL BUS BAR

(71) Applicants: SHANGHAI TIANYANG HOT MELT ADHESIVE CO., LTD., Shanghai (CN); EAST CHINA UNIVERSITY OF SCIENCE AND TECHNOLOGY, Shanghai (CN); KUNSHAN TIANYANG HOT MELT ADHESIVE CO., LTD., Kunshan, Jiangsu (CN)

(72) Inventors: Weilan Xue, Shanghai (CN); Ping Zhao, Shanghai (CN); Zhelong Li, Shanghai (CN); Wanyu Zhu, Shanghai (CN); Zuoxiang Zeng, Shanghai (CN); Xu Gao, Shanghai (CN); Juan Liu, Jiangsu (CN)

(73) Assignees: SHANGHAI TIANYANG HOT MELT ADHESIVE CO., LTD., Shanghai (CN); EAST CHINA UNIVERSITY OF SCIENCE AND TECHNOLOGY, Shanghai (CN); KUNSHAN TIANYANG HOT MELT ADHESIVE CO., LTD., Kunshan, Jiangsu (CN)

( * ) Notice: Subject to any disclaimer, the term of this patent is extended or adjusted under 35 U.S.C. 154(b) by 0 days.

(21) Appl. No.: 14/358,667

(22) PCT Filed: Oct. 24, 2013

(86) PCT No.: PCT/CN2013/085891
§ 371 (c)(1),
(2) Date: May 15, 2014

(87) PCT Pub. No.: WO2014/063646
PCT Pub. Date: May 1, 2014

(65) Prior Publication Data
US 2014/0316067 A1 Oct. 23, 2014

(30) Foreign Application Priority Data
Nov. 27, 2012 (CN) .......................... 2012 1 0489466

(51) Int. Cl.
| | |
|---|---|
| C09D 123/06 | (2006.01) |
| H01L 31/02 | (2006.01) |
| C09J 123/06 | (2006.01) |
| C09J 167/02 | (2006.01) |
| C08L 23/06 | (2006.01) |
| H01L 31/048 | (2014.01) |

(52) U.S. Cl.
CPC .............. *C09J 123/06* (2013.01); *C08L 23/06* (2013.01); *C09D 123/06* (2013.01); *C09J 167/02* (2013.01); *H01L 31/0201* (2013.01); *H01L 31/048* (2013.01)

(58) Field of Classification Search
None
See application file for complete search history.

(56) References Cited

U.S. PATENT DOCUMENTS

2012/0115997 A1* 5/2012 Hamilton et al. .............. 524/139

FOREIGN PATENT DOCUMENTS

| CN | 1555396 A | 12/2004 |
|---|---|---|
| CN | 101121792 A | 2/2008 |
| CN | 101353562 A | 1/2009 |
| CN | 101628999 A | 1/2010 |
| CN | 101796095 A | 8/2010 |
| CN | 102925079 A | 2/2013 |
| JP | S 5638367 A | 4/1981 |
| JP | 2003192775 A | 7/2003 |

* cited by examiner

*Primary Examiner* — Jeffrey Mullis
(74) *Attorney, Agent, or Firm* — Muncy, Geissler, Olds & Lowe, P.C.

(57) ABSTRACT

A method of preparing a polyester/polyolefin hot-melt adhesive for use in a solar cell bus bar is disclosed, in which 2,6-naphthalenedicarboxylic acid and ethylene glycol are first sequentially subjected in a predetermined ratio to esterification and polycondensation in the presence of a certain amount of a titanium-based catalyst to result in a polyethylene naphthalate (PNT) with a weight-average molecular weight of 16,000~20,000. The PNT is then melt-blended with a low-density polyethylene (LDPE) in the presence of a compatibilizer to produce the hot-melt adhesive that can be shaped into films having a high light transmittance, good mechanical properties, high heat and yellowing resistance and thus particularly suitable for use in solar cell bus bars.

2 Claims, No Drawings

METHOD FOR PREPARATION OF POLYESTER/POLYOLEFIN HOT-MELT ADHESIVE FOR USE IN A SOLAR CELL BUS BAR

TECHNICAL FIELD

This invention relates generally to methods of preparing a polyester/polyolefin hot-melt adhesive, and more particularly to methods of preparing a polyester/polyolefin hot-melt adhesive with a high weather resistance for use in a solar cell bus bar.

BACKGROUND

Bus bar strips, also known as laminated bus strips, are a kind of multi-layer laminated structures used as electrical couplings for power modules. They have a variety of characteristics, such as repeatable electrical properties, low inductance, high interference immunity, high reliability and space-saving, and find increasingly extensive use in power conversion devices thanks to the development of current conversion technology and increasing modularization of converters in this regard. In recent years, in particular with the increasing application of solar cells, there is great demand for developing hot-melt adhesives suited for use in bus bars of solar cells. To meet this demand, the hot-melt adhesives are required to have a light transmittance of 93%~94%, a melting point below the laminating temperature of 140° C., good mechanical properties, high heat resistance and a thermal oxidative aging caused increase in yellowness index ($\Delta YI$) of about 0.3.

Low-density polyethylene, LDPE for short, is one of the most commonly used polymer materials and is odorless and non-toxic and exhibits a wax like feel. It has excellent low temperature performance with its minimum usable temperature as low as $-70°$ C.~$-100°$ C., high chemical stability, resistance to most acids and alkalis and good electrical insulation properties, and is hence massively used in the production of films and injection molded products. However, LDPE is very sensitive to environmental stresses and has poor mechanical properties and low thermal aging resistance. On the other hand, although polyethylene naphthalate, PNT for short, is a polyester resin superior in mechanical properties and weather resistance, its application in certain fields is limited due to a relatively high melting point.

CN101628999A discloses a method in which polyethylene (PE) scraps are melt-blended as a raw material with a pre-prepared modifier and subjected to a number of processes to produce a plastic material having the same or similar quality as new PE material. CN101121792A discloses a method in which ethylene vinyl acetate/polyethylene (EVA/PE) blends are oxidized with ozone to produce an improved foaming material. Furthermore, there are numerous literatures regarding the modification of PE by physically blending it with, for example, polypropylene (PP), polycarbonate (PC), or polybutylene terephthalate (PBT), to improve its resistance to environmental stresses and mechanical properties.

While these patent literatures provide an effective practice of performance improvement of polyethylene, none of the modified materials can meet the aforementioned requirements for a suitable hot-melt adhesive for use in solar cell bus bars. The present invention is able to prepare a polyester/polyolefin hot-melt adhesive for use in solar cell bus bars through blending an LDPE with a PNT having a relatively low molecular weight.

SUMMARY OF THE INVENTION

The present invention is directed to a method of preparing a hot-melt adhesive for use in a solar cell bus bar, including the following steps:

1) sequentially adding 2,6-naphthalenedicarboxylic acid, ethylene glycol and a titanium-based catalyst, in a predetermined ratio, into a three-necked flask equipped with a thermometer, a stirrer and a reflux condenser to initiate an esterification reaction under a normal pressure at a temperature of 200° C.~245° C., and terminating the esterification reaction when an amount of water resulting therefrom reaches 92%~96% of an amount of calculation; 2) performing a polycondensation reaction at a temperature of 245° C.~265° C. for 1.3 h~1.8 h in vacuum with a pressure of 500 Pa~650 Pa to result in a polyethylene naphthalate (PNT) with a weight-average molecular weight of 16,000~20,000; and 3) melt-blending the PNT resulting from step 2) with a compatibilizer and a low-density polyethylene (LDPE) to produce the hot-melt adhesive for use in a solar cell bus bar, wherein the 2,6-naphthalenedicarboxylic acid and the ethylene glycol are in a molar ratio of 1:1.8; wherein the hot-melt adhesive consists of 4.7%~14% by weight of the PNT, 78%~89% by weight of the LDPE, and 5.7%~8.2% by weight of the compatibilizer; wherein the LDPE exhibits a melt flow rate (MFR) of 2.0 g/10 min~3.0 g/10 min at 190° C./2.16 kg; and wherein the compatibilizer is an LDPE grafted by maleic anhydride at a grafting ratio of 1.0%~2.0% and exhibits an MFR of 2.0 g/10 min~3.0 g/10 min at 190° C./2.16 kg.

The titanium-based catalyst may be tetrabutyl titanate or tetraethyl titanate with an amount of 0.045%~0.055% by weight of a total weight of the 2,6-naphthalenedicarboxylic acid and the ethylene glycol.

The novelty of the present invention lies in blending an LDPE with a PNT having a relatively low molecular weight (16000~20000) as a modifier and a maleic anhydride grafted LDPE as a compatibilizer to produce a polyester/polyolefin hot-melt adhesive that possesses good mechanical properties and high heat and weather resistance and is thus particularly suitable for use in a solar cell bus bar.

DETAILED DESCRIPTION OF PREFERRED EMBODIMENTS

The invention is explained in greater detail below on the basis of some embodiments which are illustrative and not limitative of the invention.

Embodiment 1

179.4 g of 2,6-naphthatenedicarboxylic acid and 120.6 g of ethylene glycol were charged into a 1-L reactor, followed by further adding therein 0.135 g of tetrabutyl titanate, which was introduced as a catalyst and had a weight of 0.045% of the total weight of the 2,6-naphthalenedicarboxylic acid and the ethylene glycol, to initiate an esterification reaction. The reaction was run under the normal pressure at a temperature of 200° C. to 242° C. and was terminated when the amount of water resulting therefrom reached 93% of the amount of calculation. Afterward, the reactor was vacuumed to a pressure of 500 Pa and a polycondensation reaction was initiated and maintained at a temperature of 243° C. to 263° C. for 1.8 hours to result in a PNT, whose weight-average molecular weight was measured as 18,000 by gel permeation chromatography (GPC). The PNT was then melt-blended uniformly with a low-density polyethylene (LDPE) that exhibited a melt flow rate (MFR) of 2.0 g/10 min when 2.16 kg of it was measured at a temperature of 190° C. and another LDPE serving as a compatibilizer that was grafted by maleic anhydride at a grafting ratio of 1.0% and also exhibited an MFR of 2.0 g/10 min when 2.16 kg of it was measured at a temperature of 190° C., such that the blend, namely, a hot-melt adhesive for use in solar cell bus bars of the invention, consisted of, by weight, 4.7% of the PNT, 89% of the LDPE and 6.3% of the compatibilizer. After the blend was extracted out from the reactor, it was hot pressed into a film and resulted in a sample P1.

Embodiment 2

179.4 g of 2,6-naphthalenedicarboxylic acid and 120.6 g of ethylene glycol were charged into a 1-L reactor, followed by further adding therein 0.153 g of tetraethyl titanate, which was introduced as a catalyst and had a weight of 0.051% of the total weight of the 2,6-naphthalenedicarboxylic acid and the ethylene glycol, to initiate an esterification reaction. The reaction was run under the normal pressure at a temperature of 202° C. to 243° C. and was terminated when the amount of water resulting therefrom reached 92% of the amount of calculation. Afterward, the reactor was vacuumed to a pressure of 550 Pa and a polycondensation reaction was initiated and maintained at a temperature of 242° C. to 265° C. for 1.5 hours to result in a PNT, whose GPC-measured weight-average molecular weight was 16,000. The PNT was then melt-blended uniformly with an LDPE that exhibited an MFR of 3.0 g/10 min when 2.16 kg of it was measured at a temperature of 190° C. and another LDPE serving as a compatibilizer that was grafted by maleic anhydride at a grafting ratio of 2.0% and exhibited an MFR of 2.0 g/10 min when 2.16 kg of it was measured at a temperature of 190° C., such that the blend, namely, a hot-melt adhesive for use in solar cell bus bars of the invention, consisted of, by weight, 7.3% of the PNT, 87% of the LDPE and 5.7% of the compatibilizer. After the blend was extracted out from the reactor, it was hot pressed into a film and resulted in a sample P2.

Embodiment 3

179.4 g of 2,6-naphthalenedicarboxylic acid and 120.6 g of ethylene glycol were charged into a 1-L reactor, followed by further adding therein 0.147 g of tetraethyl titanate, which was introduced as a catalyst and had a weight of 0.049% of the total weight of the 2,6-naphthalenedicarboxylic acid and the ethylene glycol, to initiate an esterification reaction. The reaction was run under the normal pressure at a temperature of 203° C. to 245° C. and was terminated when the amount of water resulting therefrom reached 96% of the amount of calculation. Afterward, the system was vacuumed to a pressure of 660 Pa and a polycondensation reaction was initiated and maintained at a temperature of 245° C. to 262° C. for 1.7 hours to result in a PNT, whose GPC-measured weight-average molecular weight was 17,000. The PNT was then melt-blended uniformly with a LDPE that exhibited an MFR of 2.6 g/10 min when 2.16 kg of it was measured at a temperature of 190° C. and another LDPE serving as a compatibilizer that was grafted by maleic anhydride at a grafting ratio of 1.0% and exhibited an MFR of 3.0 g/10 min when 2.16 kg of it was measured at a temperature of 190° C., such that the blend, namely, a hot-melt adhesive for use in solar cell bus bars of the invention, consisted of by weight, 10.8% of the PNT, 81% of the LDPE and 8.2% of the compatibilizer. After the blend was extracted out from the reactor, it was hot pressed into a film and resulted in a sample P3.

Embodiment 4

179.4 g of 2,6-naphthalenedicarboxylic acid and 120.6 g of ethylene glycol were charged into a 1-L reactor, followed by further adding therein 0.165 g of tetrabutyl titanate, which was introduced as a catalyst and had a weight of 0.055% of the total weight of the 2,6-naphthalenedicarboxylic acid and the ethylene glycol, to initiate an esterification reaction. The reaction was run under the normal pressure at a temperature of 201° C. to 244° C. and was terminated when the amount of water resulting therefrom reached 94% of the amount of calculation. Afterward, the system was vacuumed to a pressure of 600 Pa and a polycondensation reaction was initiated and maintained at a temperature of 244° C. to 264° C. for 1.3 hours to result in a PNT, whose GPC-measured weight-average molecular weight was 20,000. The PNT was then melt-blended uniformly with a LDPE that exhibited an MFR of 3.0 g/10 min when 2.16 kg of it was measured at a temperature of 190° C. and another LDPE serving as a compatibilizer that was grafted by maleic anhydride at a grafting ratio of 1.5% and exhibited an MFR of 2.0 g/10 min when 2.16 kg of it was measured at a temperature of 190° C., such that the blend, namely, a hot-melt adhesive for use in solar cell bus bars of the invention, consisted of, by weight, 14.0% of the PNT, 78% of the LDPE and 8.0% of the compatibilizer. After the blend was extracted out from the reactor, it was hot pressed into a film and resulted in a sample P4.

Each of the samples P1 to P4 was subjected to a differential scanning calorimtry (DSC) test, a light transmittance test and a test for measuring thermo-oxidative aging caused change in yellowness index (i.e., ΔYI) and the results were presented in the following Table 1. Wherein, the ΔYI was measured according to the Chinese National Standard GB2409-80 "Test Method for Yellowness Index of Plastics".

TABLE 1

Measurement results of samples of EMBODIMENTS 1-4

| Sample | DSC measured melting point (° C.) | Light transmittance (%) | Thermo-oxidative aging caused change in yellowness index (ΔYI) |
|---|---|---|---|
| P1 | 109 | 95 | 0.30 |
| P2 | 108 | 94 | 0.31 |
| P3 | 110 | 94 | 0.29 |
| P4 | 112 | 93 | 0.30 |

What is claimed is:
1. A method of preparing a polyester/polyolefin hot-melt adhesive for use in a solar cell bus bar, comprising the steps of:
  1) sequentially adding 2,6-naphthalenedicarboxylic acid, ethylene glycol and a titanium-based catalyst, in a predetermined ratio, into a three-necked flask equipped with a thermometer, a stirrer and a reflux condenser to initiate an esterification reaction under a normal pressure at a temperature of 200° C. to 245° C., and terminating the esterification reaction when an amount of water resulting therefrom reaches 92% to 96% of an amount of calculation;
  2) performing a polycondensation reaction at a temperature of 245° C. to 265° C. for 1.3 h to 1.8 h in vacuum with a pressure of 500 Pa to 650 Pa to result in a polyethylene naphthalate (PNT) with a weight-average molecular weight of 16,000 to 20,000; and

3) melt-blending the PNT resulting from step 2) with a compatibilizer and a low-density polyethylene (LDPE) to produce the hot-melt adhesive for use in a solar cell bus bar, wherein the 2,6-naphthalenedicarboxylic acid and the ethylene glycol are in a molar ratio of 1:1.8;

wherein the hot-melt adhesive consists of 4.7% to 14% by weight of the PNT, 78% to 89% by weight of the LDPE, and 5.7% to 8.2% by weight of the compatibilizer;

wherein the LDPE exhibits a melt flow rate (MFR) of 2.0 g/10 min to 3.0 g/10 min at 190° C./2.16 kg; and wherein the compatibilizer is an LDPE grafted by maleic anhydride at a grafting ratio of 1.0% to 2.0% and exhibits an MFR of 2.0 g/10 min to 3.0 g/10 min at 190° C./2.16 kg.

2. The method of claim 1, wherein the titanium-based catalyst is tetrabutyl titanate or tetraethyl titanate with an amount of 0.045% to 0.055% by weight of a total weight of the 2,6-naphthalenedicarboxylic acid and the ethylene glycol.

* * * * *